United States Patent [19]

Blossfeld

[11] Patent Number: 4,882,297

[45] Date of Patent: Nov. 21, 1989

[54] METHOD OF MAKING A SELF-ALIGNED SILICIDE CONTACT USING POLYSILICON ELECTRODE AS AN ETCH MASK

[75] Inventor: Lothar Blossfeld, Freiburg, Fed. Rep. of Germany

[73] Assignee: Deutsche ITT Industries GmbH, Freiburg, Fed. Rep. of Germany

[21] Appl. No.: 205,589

[22] Filed: Jun. 13, 1988

Related U.S. Application Data

[63] Continuation of Ser. No. 905,757, Sep. 9, 1986, abandoned.

[30] Foreign Application Priority Data

Sep. 21, 1985 [EP] European Pat. Off. ........ 85111972.7

[51] Int. Cl.$^4$ ................. H01L 21/225; H01L 21/283; H01L 21/302
[52] U.S. Cl. ........................ 437/200; 437/162; 437/193; 437/203; 437/33; 437/31; 437/69; 437/984; 437/63; 148/DIG. 19; 148/DIG. 105; 148/DIG. 123; 148/DIG. 124; 156/653; 156/657
[58] Field of Search ................. 437/31, 32, 33, 69, 437/63, 162, 192, 193, 203, 984, 200; 156/657, 563; 148/DIG. 19, DIG. 105, DIG. 123, DIG. 124

[56] References Cited

U.S. PATENT DOCUMENTS

| 4,188,707 | 2/1980 | Asano et al. | 437/31 |
|---|---|---|---|
| 4,381,935 | 5/1983 | Ho et al. | 437/33 |
| 4,429,850 | 2/1984 | Weber et al. | 248/250 |
| 4,477,965 | 10/1984 | Blossfeld | 437/31 |
| 4,531,282 | 7/1985 | Sakai et al. | 437/31 |
| 4,581,319 | 4/1987 | Weider et al. | 437/33 |
| 4,625,391 | 12/1986 | Sasaki et al. | 437/33 |
| 4,709,469 | 12/1987 | Hirao | 437/193 |
| 4,740,482 | 4/1988 | Hirao | 437/33 |

OTHER PUBLICATIONS

Sakai et al., *Japanese J. of Applied Physics*, vol. 20, 1981, Suppl. 20-1, pp. 155-159.
Metz et al., *IEEE Electron Device Letters*, vol. EDL-6, No. 7, Jul. 1985, pp. 372-373.
Barson et al., *IBM Tech. Disc. Bull.*, vol. 24, No. 7A, Dec. 1981, pp. 3424-3426.
Jambotka, C., *IBM Tech. Disc. Bull.*, vol. 23, No. 12, May 1981, pp. 5384-5387.

Primary Examiner—Brian E. Hearn
Assistant Examiner—T. N. Quach
Attorney, Agent, or Firm—Thomas L. Peterson

[57] ABSTRACT

In fabricating the contact, the electrode layer of polycrystalline silicon whose rim portion is bonded via a layer portion of insulating material to the substrate, is used at least throughout the length of a part of its rim portion for the lateral delimitation of a etching process, as an etch mask, in the course of which a frame-shaped layer portion is formed underneath the rim portion of the electrode layer, and the contact area of the substrate as bordering on the layer portion is exposed. Following the deposition of a metal layer of a metal forming a silicide in a thickness smaller than the thickness of the layer portion, and the heating for forming the silicide, the metal which has so far not reacted with the silicon, is removed by using an etching agent selectively dissolving the metal.

16 Claims, 3 Drawing Sheets

METHOD OF MAKING A SELF-ALIGNED SILICIDE CONTACT USING POLYSILICON ELECTRODE AS AN ETCH MASK

This is a continuation of application Ser. No. 905,757 filed Sept. 9, 1986 now abandoned.

BACKGROUND OF THE INVENTION

The invention pertains to a method of attaching a self-aligned contact in the direct proximity of an electrode layer of polycrystalline silicon. Such a method is known from DE-A1-32 43 059 and is of particular significance with respect to integrated bipolar transistors for use with highest-frequency circuits.

In the method as disclosed in the aforementioned German Offenlegungsschrift, for the electrode layer as well as for the contact a polycrystalline silicon is used for the emitter electrode layer as well as for the base contact which is doped in accordance with the conductivity type of the regions to be contacted and is used as a source of diffusion and as a contacting material as well. The emitter electrode layer is aligned to the emitter region, and the base contact is aligned to the outer inactive base region. Thus, the mutual alignment of the individual contacts to the respective region to be contacted is not subjected to the alignment tolerances of a photolithographic process. In fact, in this conventional method a uniform edge isolation of the base contact from the emitter electrode is achieved by employing a special dry etching process, so that the contacts with their regions are also self-aligned in relation to one another. The special dry etching process comprises the steps of reactive ion etching in a gas atmosphere composed of a mixture of $SF_6$, inert gas and oxygen, the relative constituent proportions of the mixture being adjusted in different amounts according to the layer to be etched.

Such a self-alignment is also achieved with the so-called "SST"-structures as disclosed in pages 155 to 159 in Vol. 20 (1981) Suppl. 20-1 of the "Japanese Journal of Applied Physics" and is based on the establishment of the edge isolation by employing a thermal oxidation of the polycrystalline silicon. In this process an N+ emitter region, a base p region, a p+ base region, a base p+ polysilicon electrode and the spacing between the emitter n+ region and base contact are formed by one mask process. The processes for forming the transistor active region are all self-aligned.

The aforementioned methods have the disadvantage of restricting the material of both the electrode layer and the contact to polycrystalline silicon. Another essential disadvantage is that an overlapping of both the electrode layer and the contact is unavoidable. Such an overlapping, however, is the cause of an increased emitter-base capacity in the case of integrated high frequency circuits which contain such bipolar transistors as are disclosed in the aforementioned prior publications.

SUMMARY OF THE INVENTION

It is one object of the invention, therefore, to provide a method which, in the case of integrated circuits, permits establishment of a self-aligning contact in the direct proximity of an electrode layer without any overlapping.

The invention, accordingly, relates to a method of attaching a contact to a contact area of a substrate of semiconducting material, in the direct proximity of an electrode layer of polycrystalline silicon, which is connected to the substrate on the contact surface of the electrode layer. Thus, relative thereto, it is taken for granted that the rim of the electrode layer is connected to the substrate at least partly via a frame-shaped layer portion of insulating material. With the conventional types of bipolar transistors according to the aforementioned prior publications this is the case due to the mentioned overlapping throughout the entire rim portion of the electrode layer.

In fabricating the contact, the electrode layer of polycrystalline silicon whose rim portion is bonded via a layer portion of insulating material to the substrate, is used at least throughout the length of a part of its rim portion for the lateral delimitation of an etching process, as an etch mask, in the course of which a frame-shaped layer portion is formed underneath the rim portion of the electrode layer, and the contact area of the substrate as bordering on the layer portion is exposed. Following the deposition of a metal layer of a metal forming a silicide in a thickness smaller than the thickness of the layer portion, and the heating for forming the silicide, the metal which has so far not reacted with the silicon, is removed by using an etching agent for selectively dissolving the metal.

Accordingly, the essential features of the method of this invention are in the use of the electrode layer as an etch mask, in order thus to expose the semiconductor surface at least over a part of the rim portion of the electrode layer, and in the use of a metal which is capable of forming a silicide, which superficially forms a silicide layer with both the electrode layer and the substrate. Examples of such metals are tungsten or platinum, of. "IEEE Electron Device Letters", Vol. EDL-6, No. 7 (July 1985), pp. 372 to 374. As cited therein at page 372, the selective deposition of tungsten utilizing the reduction of $WF_6$ has been achieved by proper selection of temperature, gas flows, pressures and substrate preparation so that tungsten is deposited only on exposed silicon and not on the surrounding oxide. Further examples are molybdenum, tantalum or titanium, as known from DE-A1-33 15 719, corresponding to U.S. Pat. No. 4,479,850.

BRIEF DESCRIPTION OF THE DRAWING

In the following, the invention will now be explained with reference being had to FIGS. 1 to 10 of the accompanying drawings, in which.

DETAILED DESCRIPTION

The method according to this invention can be used especially advantageous in fabricating mololithically integrated super-high frequency circuits employing integrated bipolar transistors of the type as known from EP-A1-71 665, corresponding to U.S. Pat. No. 4,477,965. In the course of this method, chiefly by employing an oxidation masking layer covering up the emitter region of an integrated bipolar transistor, and which layer is of defined thickness, there are carried out two successively following implantation processes of different acceleration energy, in which once the dopings of the inactive base region and once the dopings of the active base region are implanted. Moreover, the oxidation masking layer permits the establishment of the implantation mask or the dopings of the emitter region in a self-aligning manner, in relation to the base region. In this conventional method, however, the fabrication of contacts or electrodes which are self-aligning with respect to reach each other and with respect to the regions, is not provided for. But for this purpose the method according to the invention offers an extremely advantageous solution.

Figure 1:
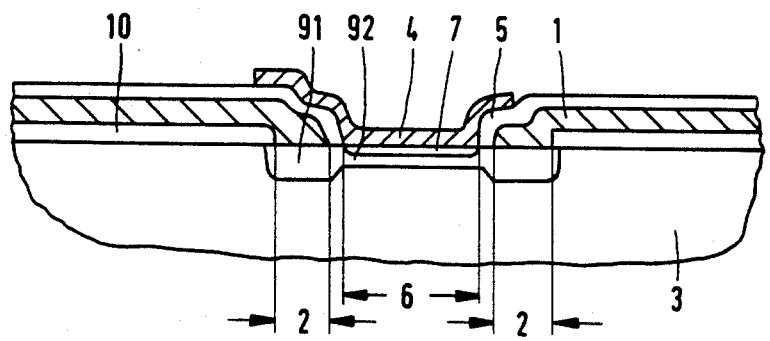
FIG. 1 serves to explain the initially mentioned conventional methods.

FIG. 1, in a cross-sectional view, illustrates an integrated bipolar transistor of the type which is capable of being fabricated in the substrate 3 in accordance with the processes disclosed in the aforementioned prior art publications. For this purpose the substrate 3 is thermally oxidized and, following the delimitation of a field oxide layer 10, an area on the substrate surface is exposed which includes the contact area 2 of the inactive outer base region 91 and the emitter area 6 of the emitter region 7. For example, by evaporating silicon which contains dopings of the conductivity type of the base region, and by employing a photolithographic etching process, the contact of the inactive base region 91 is deposited, which surrounds the emitter area 6. For establishing the edge isolation of the base contact 1 with respect to the emitter electrode layer 4 still to be produced, there is deposited in the method according to the aforementioned DE-A1-32 43 059 a layer of SiO$_2$ and the whole arrangement is subjected to a special kind of etching process, so that the frame-like layer portion 5 results. Alternatively, it is possible for this purpose, in accordance with the aforementioned passage of literature from the "Japanese Journal of Applied Physics", to subject the base contact 1 to a thermal oxiation process. Following the fabrication of the emitter electrode layer 4 from polycrystalline material which contains dopings of the conductivity type of the emitter region 7, by employing an evaporation process and a photolithographic etching process, the arrangement is heated up to a temperature which is sufficient for causing a diffusion of the dopings out of the polycrystalline silicon layers. In this way there is obtained an integrated bipolar transistor of the type as shown in FIG. 1, whose base contact 1 to the inactive base region 91, whose emitter electrode layer 4 to the emitter region 7, and whose region parts among each other have been embodied in a self-aligning way. The dopings of the active base region 92 are introduced into the exposed surface of the substrate 3 prior to the deposition of the emitter electrode layer 4 by employing an ion implantation process.

Figure 2:
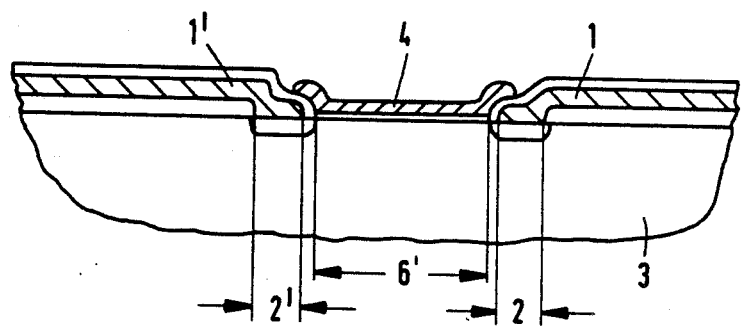
FIG. 2 refers to one practical application of the method according to the invention.

In the same way as described hereinbefore with reference to FIG. 1, of course, there may also be produced a semiconductor device of the type of which a cross-sectional view is shown in FIG. 2, viz. a MOS semiconductor diode whose contact 1 is attached in the direct proximity of the MOS electrode layer on the surface of the substrate 3, in order thus to obtain a small as possible series resistance with the area below the contact surface 6' of the electrode layer 4.

Figure 3:
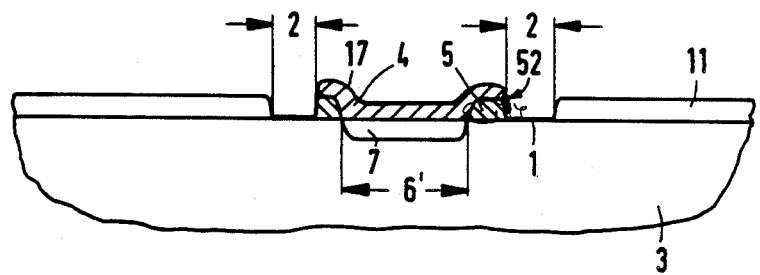
FIG. 3 serves to explain the processing steps which are essential for the method according to the invention.

FIG. 3 illustrates one of the most simple applications of the method according to the invention for fabricating an integrated PN planar diode with the region 7 forming a PN junction in the substrate 3, which is contacted to the electrode layer 4. For fabricating the PN planar diode, for example, the surface of the substrate 3 may be subjected to a thermal oxidation and the contact area 6' of the electrode layer 4 may be exposed on the substrate surface by employing a photolithographic etching process. After that the dopings of the region 7, by using the remaining parts of the oxide layer, are implated into the exposed surface of the substrate 3. On this there is deposited a layer of polycrystallin silicon with dopings of the conductivity type of the region 7 and, again by employing a second photolithographic etching process, there is produced the electrode layer 4. This photolithographic etching process is merely aimed at safeguarding insuring that a layer portion 5 is produced from the insulating matrial of the oxide layer 11 which extends at least partially over the rim portion of the electrode layer 4. After that, and by using the electrode layer 4 as an etch masking layer, and a layer of photoresist leaving free the contact area 2, the insulating material covering this contact area 2 is etched away. The photoresist is then removed and platinum is evaporated over the entire upper surface side of the substrate 3. The arrangement or device is then heated up to a temperature sufficient for forming the platinum silicide, with the arrangement then being dipped into aqua regia which is an etching agent attacking platinum, but not platinum silicide to any noteworthy extent. Considering that the thickness of the layer portion 5, according to the teaching of the invention, is greater than the thickness of the platinum layer, there will remain on the edge 52 of the frame-like layer portion 5 merely a frame-like portion of platinum which, just like the portion of platinum on the insulating layer 11, is selectively removed in the course of the etching process. In this way there is obtained an arrangement or device comprising platinum silicide contact areas 1, 17 which, through the openings in a foreign oxide layer, can be interconnected in the conventional way with the aid of conductor leads.

While in the example of embodiment described with reference to FIG. 3, the layer portion 5 is used as part of a restrictive masking for a process of implanting into the surface of the substrate prior to the fabrication of the electrode 4, this electrode 4, of course, may also be used itself in the conventional manner as a source of diffusion, for diffusing the region 7 into the substrate 3. In that case the layer portion 5 itself becomes effective as part of a diffusion mask.

Figure 4:
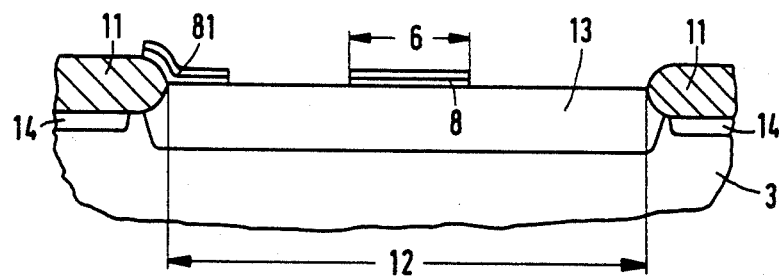
FIGS. 4 to 9 show successively following work stages in the preferred application of the method according to the invention in connection with the fabrication of a bipolar transistor of a monolithic integrated highest frequency circuit.

In the following and with reference to FIGS. 4 to 10 of the accompanying drawings, the preferred example of embodiment of the method according to the invention of attaching a contact in the direct proximity of an electrode layer of an integrated bipolar transistor, consisting of polycrystalline silicon, in accordance with the method disclosed in the aforementioned EP-A1-71 665, will now be explained. Relative thereto, there is started out from the stage as shown in FIG. 4. This FIG. 4, as part or section of a monolithically integrated solid-state circuit, shows the collector region 13 of an integrated bipolar transistor, which superficially occupies the area 12. This area 12 is restricted by the field oxide layer 11 as obtained from the employment of thermal oxidation and by using an oxidation masking layer which covered up the area 12. Below the field oxide layer 11 there are channel stop regions 14 which are doped higher than the substrate 3, with the dopings thereof having been introduced into the surface of the substrate 3 prior to the thermal oxidation of the field oxide layer 11. Upon removal of the not shown oxidation masking layer, the dopings of the collector region 13 are introduced by employing the field oxide layer 11 as masking, so that, following a heating process, the collector region 13 is obtained. After that, on the free surface of the arrangement, thereis deposited the layer sequence of a further oxidation masking layer consisting of a lower $SiO_2$ layer and an upper $Si_3N_4$ layer, out of which there is etched a layer portion 8 covering up the emitter region 6 and, at the rim portion of the collector region, a layer portion 81 overlapping the field oxide layer 11. This is the way in which the arrangement or device as shown in FIG. 4 is obtained.

Figure 5:
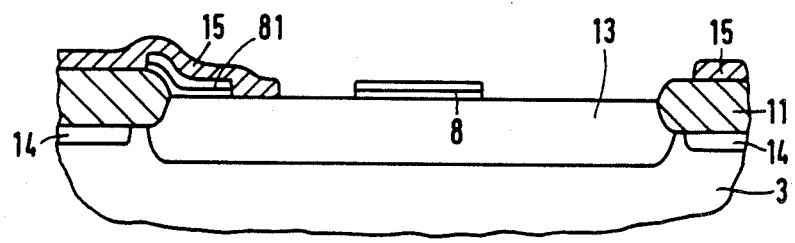

Next, as shown in FIG. 5, a photoresist mask 15 is deposited which leaves free the base area and forms the boundary thereof together with parts of the field oxide layer 11—on the right-hand side in FIG. 5. There is now effected the implantation of the dopings of the base region, with this implantation in any arbitrary order of succession, being carried out once in a high dose and at a low energy, and once at a high energy level and in a low (small) dose. The thickness of the oxidation masking layer 8 is in such a way adapted to the implantation conditions that it can be penetrated at high energy, while low-energy ions are masked. As is referred to in the aforementioned EP-A1-71 665, there is obtained in this way below the oxidation masking layer portion 6, hence below the emitter region still to be produced, the active base region and, below the portions of the exposed substrate surface, the inactive base region 91, as can be seen from the following FIGS. 6 and 7.

Figure 6:
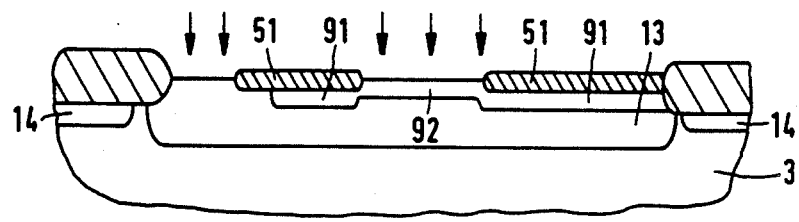

After that the photoresist mask 15 which likewise masked against the implantation of the ions of the base region, is removed and the exposed substrate surface is oxidized, in the course of which the oxide layer 51 is obtained. Then the layer portions 8 and 81 of the oxidation masking layer are removed so that the arrangement as shown in FIG. 6 will result.

Figure 7:
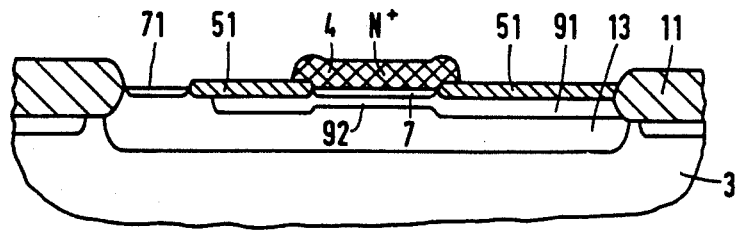

Now follows a process of implanting dopings of the conductivity type of the emitter region in a sufficiently high dose, but at a relatively low accelerating energy. From FIG. 6 the purpose of the oxidation masking layer 81 as shown in FIGS. 4 and 5 becomes recognizable, namely the protection against the oxidation in the course of which the oxide layer 51 was obtained. In fact, during the implantation of the dopings of the emitter region 7, also the dopings of a collector contacting region 71 as shown in FIG. 7 are implanted, as is denoted by the arrows. For producing the doped electrode layer 4 there is carried out a process of evaporating polycrystalline silicon, the doping of which is effected by way of ion implantation, and there is also employed a photolithographic etching process for the delimitation purpose. When the layer 7 is produced by way of diffusion from polycrystalline silicon, it is sufficient for the emitter implantation process to be carried out after the process of etching the polycrystalline silicon. In that way the additional implantation of the polycrystalline silicon layer may be omitted.

Figure 8:
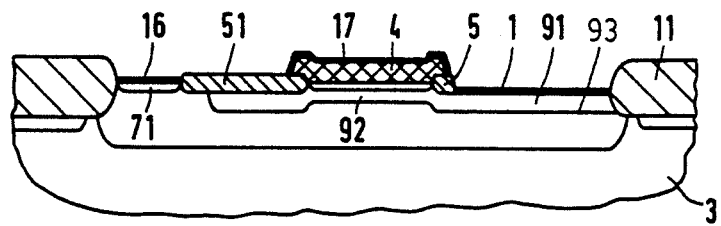
Figure 9:
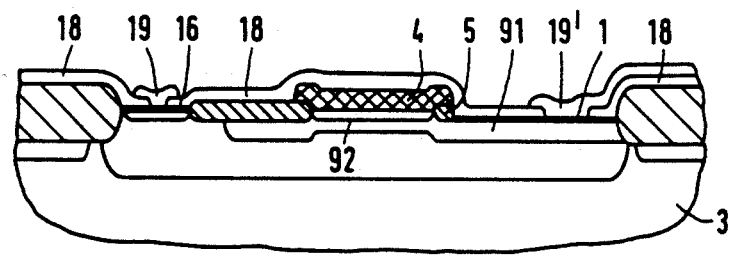

It is in the stage of fabrication as shown in FIG. 7 where the method according to the invention sets in. First, there is carried out a photolithographic etching process, preferably the anisotropic dry etching process as referred to in the already mentioned DE-A1-32 43 059, in order thus to expose part of the semiconductor surface of the inactive base region 91 which is to be contacted, as shown in FIG. 8. One part of the oxide layer 51, i.e. the part adjoining the collector contacting region 71, where the base-collector PN junction emerges on the semiconductor surface, remains preserved. This, however, is not necessary in the right-hand portion of FIG. 8 because there the base-collector PN junction 93 meets against the field oxide layer 11 and not against the free semiconductor surface.

The etching process for removing the oxide layer 51 is to be carried out in such a way as not to interrupt the frame-shaped layer portion 5 which is overlapped by the electrode layer 4, and that no cavities are formed below the overlapping part. In fabricating the emitter region, of course, there may also be used the conventional method of diffusing the emitter region from the electrode layer 4, as a doping source.

After the substrate surface has been exposed within the area of the inactive base region as shown in FIG. 8, the upper surface side of the arrangement or device is evaporated with platinum and, thereafter, heated to such an extent that platinum silicide is formed at all points where the silicon was exposed during the evaporation with platinum. Following an etching process by using an etching agent, such as aqua regia, which selectively attacks the platinum, there is obtained an arrangement or device of the type as shown in FIG. 8, with layers 16, 17 of platinum silicide which are separated from one another.

In the arrangement as shown in FIG. 8 the contact 1 is defined by the surface layer of the outer base region 91 consisting of platinum silicide, and is disposed in the direct or close proximity of the electrode layer 4, namely at a spacing almost corresponding to the thickness of the frame-shaped layer portion 5, as being overlapped by the electrode layer 4. Accordingly, the electrical connection of the active base region 92 is established in a very low-ohmic manner as is desirable for highest-frequency transistors. Of course, the low-ohmic connection of the active base region 92 is the better the more the active base region 92 is surrounded by the frame-shaped layer portion 5. Relative thereto, however, it is to be borne in mind that the base-collector electrical capacitance increases as the PN junction area grows, and that the collector series resistance decreases as the surface area of the collector contact 16 becomes smaller.

Figure 10:
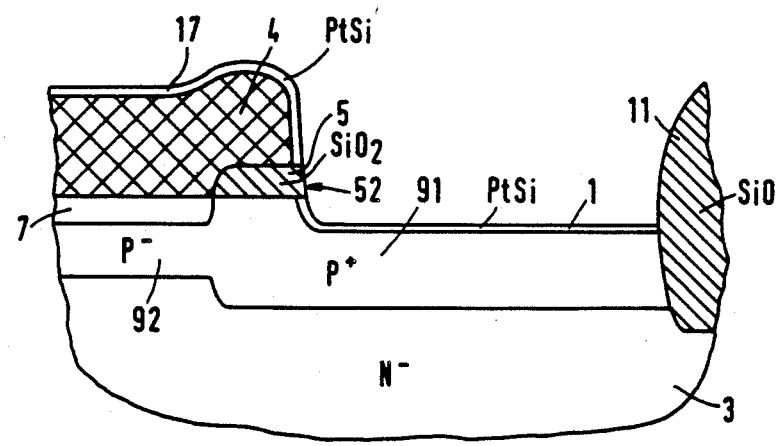
FIG. 10 shows part of a integrated bipolar transistor fabricated in accordance with the method of the invention.

FIG. 10 shows one detail of FIG. 8 on an enlarged scale and, still better than FIG. 8, permits recognition of the main features and advantages of the method according to the present invention. The main idea of the invention resides in the special utilization of the frame-shaped layer portion 5 on which the rim portion of the electrode layer 4 rests and which, via this frame-shaped layer portion 5 is bonded to the substrate. The thickness of the layer portion 5 can and should be so dimensioned that the electrical capacitance between the contact 1 and the electrode layer 4 is negligible with respect to both the emitter region 7 and the base region 91, 92. Hence, without causing any disadvantages, it may be dimensioned substantially thicker than the metal layer deposited in the course of the method according to the invention, from which the silicide is formed. In defining the lateral dimensions of the layer portion 5 merely the tolerances of the photolithographic etching process have to be taken into due consideration, with this etching process being employed for the purpose of delimitation of the electrode layer 4. Under the conditions which are predetermined by the method according to the invention, there is in any case safely excluded any short-circuiting between the electrode layer 4 and the contact 1, because at least between the contact 1 and the electrode layer 4 there exists a frame-shaped layer portion 5 of sufficient thickness. Moreover, the formation of the oxide layer 51 and the removal thereof within the area of the contact 1 offers the advantage of a sinking of the contact into the surface of the outer base region 91 and, accordingly, a further noteworthy reduction of the base terminal (lead) resistance.

To complete the integrated solid-state circuits, conductor leads are still to be attached at least to the contacts. For this purpose a foreign oxide layer 18 is deposited in accordance with the showing of FIG. 9 and, by employing a photolithographic etching process, contacting holes to the contacts 16, 1 and, by choice, to the electrode layer 4 are produced, through which contacting holes printed conductor leads 19 or 19' connect the contacts and, by choice, also the electrode layer 4 through a not shown contact hole, to the circuit.

Apart from the fact that the method according to the invention permits arbitrarily small lateral spacings between the contact and the electrode layer of a semiconductor device, especially when employing an anisotropic etching process, a particular advantage of the method according to the invention is to be seen in the fact that also the series resistance of the conductor leads which are made from polycrystalline silicon is reduced considerably in cases where the electrode layer 4 or the electrode layers of the integrated solid-state circuit is/are etched out of one common polycrystalline silicon layer. In fact, in the method according to the invention these are superficially likewise converted into a silicide. Consequently, the method according to the invention can be advantageously employed in the case of integrated circuits containing bipolar transistors as well as Si-Gate field-effect transistors. In this connection it should be mentioned that the method according to the invention also permits a very low-ohmic contacting of MOS structures, hence, for example, in the case of structures for the manufacture of which the frame-shaped layer portion is designed at the rim portion of an insulating layer whose thickness is less than that of the frame-shaped layer portion 5. Such an electrode would be suitable for use as the field-effect electrode of a depletion type field-effect transistor or also for a MOS capacitor.

What is claimed is:

1. In an integrated solid-state circuit an improvement in a method of attaching a contact to a contact area of a first active region in a substrate of semiconducting material in close direct proximity of an electrode layer of polycrystalline silicon in contact with a second active region in said substrate without danger of shorting therebetween, said contact area to be defined through an insulting layer, said contact to be bonded to the substrate on a surface of said contact area, the electrode layer having an edge portion disposed at least partially on a narrow frame-shaped layer portion of an insulating material which is disposed in turn on said substrate, said improvement comprising the steps of:
    using said electrode layer for laterally delimiting an etching process to selectively expose at least one part of a vertical rim portion of the insulating frame-shaped layer portion and an adjoining contact area of the substrate, said frame-shaped layer portion having a predetermined thickness which defines said close direct proximity between said electrode layer and said contact area;
    depositing a metal layer of a metal forming a metallic silicide onto all exposed surfaces, said metal layer having a thickness which is less than the predetermined thickness of said frame-shaped layer portion;
    heating the metal layer with the underlying silicon of the electrode layer and of the substrate to form the metallic silicide in said contact areas and on said electrode layer, without chemically reacting with the insulating material including said insulating frame layer portion; and
    removing the metal layer which has not reacted with the silicon with the aid of an etching agent which selectively dissolves the metal layer,
    whereby said electrode layer and contact may be closely positioned on said substrate with a low capacitance therebetween without danger of being shortd together.

2. The method of claim 1, wherein said electrode layer at least partly overlaps the rim portion of the frame-shaped layer portion and forms part of a conductor lead of a printed conductor pattern of said integrated solid-state circuit, said improvement further comprising the step of:
    depositing a metal layer forming a silicide on said conductor leads.

3. The method of claim 1, wherein the rim portion of the electrode layer which is in contact with the substrate restricts the regional areas of a contact region, said improvement further comprising the steps of:
    using said frame-shaped layer portion as part of a mask to expose said contact region on the surface of the substrate prior to the fabrication of said electrode.

4. The method of claim 2, where the rim portion of the electrode layer in contact with the substrate restricts a contact region, said improvement further comprising the step of:
    using said frame-shaped layer portion as part of a mask to expose said contact region on the surface of the substrate prior to the fabrication of said electrode.

5. The method of claim 1, wherein the frame-shaped layer delimits an active region which, by using the frame-shaped layer portion as part of a diffusion mask, said active region is diffused into the surface of the substrate following the fabrication of the electrode layer from a doped silicon, by means of the step of:
    using the doped electrode layer as a source of diffusion for diffusing the active region into the substrate.

6. The method of claim 2, wherein the frame-shaped layer delimits an active region which, by using the frame-shaped layer portion as part of a diffusion mask, said active region is diffused into the surface of the substrate following the fabrication of the electrode layer from a doped silicon, by means of the step of:
    using the doped electrode layer as a source of diffusion for diffusing the active region into the substrate.

7. A method as claimed in claim 3, comprising the step of:
    producing said layer portion by way of thermal oxidation of the substrate, during which the regional area of the region is protected by means of an oxidation masking layer.

8. The method of claim 4, comprising the step of:

producing said frame-shaped layer portion by way of thermal oxidation of the substrate, during which a contact region is protected by means of an oxidation masking layer.

9. The method of claim 5, comprising the step of:
producing said frame-shaped layer portion by means of thermal oxidation of the substrate, during which a contact region is protected by means of an oxidation masking layer.

10. The method of claim 6, comprising the step of:
producing said frame-shaped layer portion by way of thermal oxidation of the substrate, during which a contact regional is protected by means of an oxidation masking layer.

11. The method of claim 7, wherein the vertical thickness of said oxidation masking layer is so dimensioned that the oxidation masking layer is penetrable in the course of one of two ion implantation processes forming a base region bordering on the contact region of an integrated bipolar transistor, so that underneath said contact region a base region with an inactive base region and a thin active base region will result, further comprhe step of implanting said active and inactive base regions by selective ion implantation.

12. The method of claim 8, wherein the vertical thickness of said oxidation masking layer is so dimensioned that the oxidation masking layer is penetrable in the course of one of two ion implantation processes forming a base region bordering on the contact region of n integrated bipolar transistor, so that underneath said contact region a base region with an inactive base region and a thin active base region will result, further comprising the step of implanting said active and inactive base regions by selective ion implantation.

13. The method of claim 9, wherein the vertical thickness of said oxidation masking layer is so dimensioned that the oxidation masking layer is penetrable in the course of one of two ion implantation processes forming a base region bordering on the contact region of an integrated bipolar transistor, so that underneath said contact region a base region with an inactive base region and a thin active base region will result, further comprsing the step of implanting said active and inactive base regions by selective ion implantation.

14. The method of claim 10, wherein the vertical thickness of said oxidation masking layer is so dimensioned that the oxidation masking layer is penetrable in the course of one of two ion implantation processes forming a base region bordering on the contact region of an integrated bipolar transistor, so that underneath said contact region a base region with an inactive base region and a thin active base region will result, further comprising the step of implanting said active and inactive base regions by selective ion implantation.

15. The method of claim 1, wherein said frame-shaped layer portion is disposed at the rim portion of an insulating layer whose vertical thickness is smaller than the lateral thickness of said frame-shaped layer portion.

16. The method of claim 2, wherein said frame-shaped layer portion is disposed at the rim portion of an insulating layer whose vertical thickness is smaller than the lateral thickness of said frame-shaped layer portion.

* * * * *